Jan. 10, 1967 W. B. BRUENE 3,297,966

MODULATOR FOR GROUNDED SCREEN TETRODE R.F. POWER AMPLIFIER

Filed June 12, 1964

INVENTOR.
WARREN B. BRUENE
BY Moody and Kintzinger
ATTORNEYS

United States Patent Office
3,297,966
Patented Jan. 10, 1967

3,297,966

MODULATOR FOR GROUNDED SCREEN TETRODE R.F. POWER AMPLIFIER

Warren B. Bruene, Cedar Rapids, Iowa, assignor to Collins Radio Company, Cedar Rapids, Iowa, a corporation of Iowa Filed June 12, 1964, Ser. No. 374,629
9 Claims. (Cl. 332—60)

Figure 1:
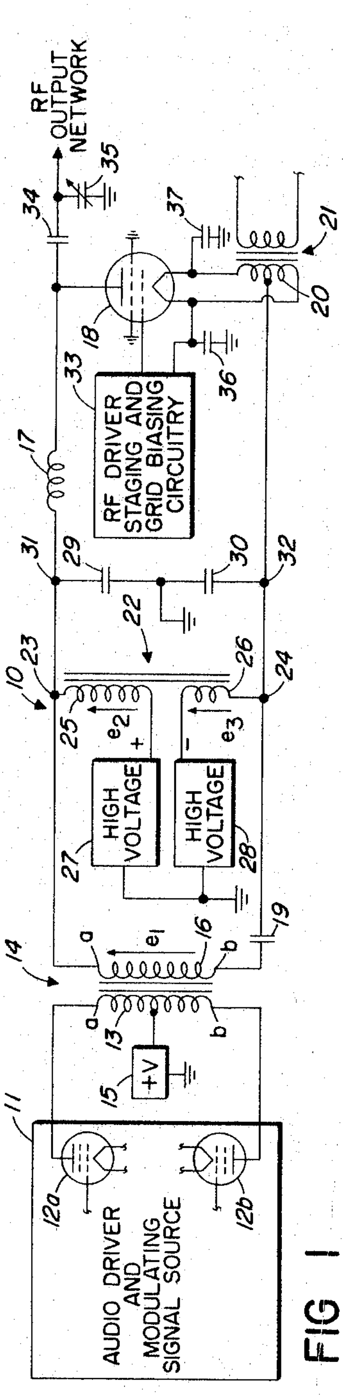

This invention relates in general to amplitude modulation of power amplifiers, and in particular to high level amplitude modulation of a tetrode R.F. power amplifier stage in which the tube screen is operated at ground potential.

In recent years tetrode R.F. power amplifier tubes have become available in rated power levels up to over 100 kw., with the principal advantage being a much higher power gain than generally available with triodes. At relatively low power levels, up to approximately 1 kw., it has been common practice to bypass tube screen connections to ground using one or more capacitors with leads as short as possible. However, with higher power tubes of necessity going to much larger physical size with operation in much higher voltages, the screen bypassing problem is greatly magnified and becomes very difficult. The effective screen bypass capacitance of such high power tubes must remain substantially constant at least over the normal operating R.F. range, such as, for example, 2 mc. to 30 mc. Furthermore, this effective capacitance should remain substantially constant up through the extended frequency range where VHF parasitics usually occur. This is required to minimize signal feedback coupling from power amplifier tube output to input circuitry at VHF frequencies where parasitic resonances nearly always occur in HF power amplifiers. The problem becomes particularly acute since, with greatly increased screen bypass capacitor physical size for the high power R.F. power amplifier tubes, such enlarged capacitors exhibit resonant nodes as a result of their large physical size. This results in such capacitors often exhibiting relatively high impedance at certain frequencies in the VHF range, such problems that may best be solved by having a power amplifier biasing and modulating system eliminating the need for such screen bypass capacitors. This has been accomplished by grounding of tetrode tube screens directly to a chassis deck, thereby achieving the best possible R.F. isolation between input and output circuits with screen voltage operation at the D.C. ground potential of the chassis. Obviously, this eliminates the need for large bypass capacitors otherwise required and eliminates undesired impedance characteristics inherent with such large capacitors, particularly in such high power and high frequency usage.

With a high power level modulated AM transmitter using tetrode tubes, it is necessary to modulate the screen supply voltage as well as the plate supply voltage. Actually, with many types of tetrodes and various tetrode circuits, the screen will modulate itself if the screen power source impedance is high at audio frequencies. Generally, however, this is not permissible in such tetrode grounded screen circuits since most require that the plate and screen supplies be floating off ground by the amount of this high power source impedance. Although theoretically many such circuits would work, they are faced with certain faults and arc-over, causing very high voltages to appear in the cathode and grid circuits. For these reasons, it is best to operate the plate and screen supplies with one side grounded with the screen still being modulated by some means.

It is, therefore, a principal object of this invention to provide modulation of the screen voltage along with the plate voltage even though the R.F. power amplifier tetrode tube screen is maintained at ground potential.

Another object is to provide substantially linear 100 percent amplitude modulation with a tetrode in class C R.F. power amplifying operation through modulation of both the screen voltage and the plate voltage even though the screen is operated at ground potential.

A further object is to maintain the plate and screen modulating voltages substantially in phase over the entire audio range.

Another object is to avoid undesired capacitance shunt with a high power amplifier screen circuit at high audio frequencies encountered in conventional tetrode power amplifier circuits.

Features of this invention useful in accomplishing the above objects include grounding of the screen of an R.F. power amplifier tetrode tube directly to chassis deck, and circuitry for modulating both the plate and cathode potentials, and by modulation of cathode potential attainment of screen voltage modulation. A push-pull modulator signal is fed to a modulator transformer to develop a modulator signal out of the modulator transformer secondary coil applied between the plate and cathode of the R.F. power amplifier. A modulator reactor is also provided, connected between the output terminals of the secondary coil of the modulation transformer and with a D.C. blocking capacitor between the modulation reactor and a terminal of the transformer secondary coil. The modulation reactor has two windings; one larger than the other with adjacent terminals connected to respective voltage supplies, one a high voltage positive supply and one a high voltage negative supply, with both the high voltage positive supply and the high voltage negative supply having a common connection to chassis ground. The modulation reactor serves a dual purpose by providing a path through one winding for applying high voltage D.C. to the R.F. power amplifier tetrode tube plate, and by transformer action developing the cathode to screen modulating voltage across the second winding. The turns ratio of one winding to the other is, for example, 20 to 1 with the closely adjacent terminals at A.C. ground. Thus, peak audio voltage from plate to ground may be, for example, +15,000 volts and with the cathode at, for example, −750 volts relative to ground. The coil winding of the modulation reactor connected to the plate of the tetrode power amplifier tube carries only plate current while the other coil winding of the modulation reactor carries the total cathode current of the power amplifier tube.

Specific embodiments representing what are presently regarded as the best modes of carrying out the invention are illustrated in the accompanying drawing.

Figure 2:
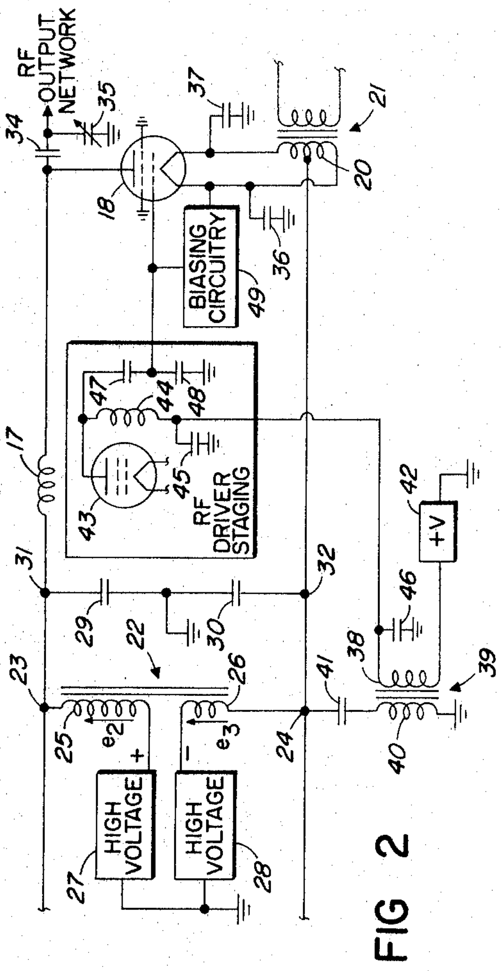

In the drawing:

FIGURE 1 represents a schematic modulating circuit for a grounded screen tetrode R.F. power amplifier tube as used in a high power short wave broadcast transmitter; and FIGURE 2, a partial schematic of another such modulating circuit also including modulating means for an R.F. driver stage driving the grid of the tetrode R.F. power amplifier tube.

Referring to the drawing:

The modulation circuit 10 of FIGURE 1, as used in a high power short wave broadcast transmitter, is shown to have an audio driver and modulating signal source circuit 11. Two modulation signal output tubes 12*a* and 12*b* provide push-pull plate outputs, respectively to the *a* and *b* terminals of the primary coil 13 of modulation transformer 14. High positive D.-C. voltage source 15 is center tap connected to transformer coil 13 as the high plate D.-C. voltage supply of both modulator audio driver tubes 12*a* and 12*b*. The secondary coil 16 of modulation transformer 14 is shown to have an *a* terminal connection through radio frequency choke coil 17 to the plate of grounded screen tetrode RF power amplifier tube 18. The *b* terminal of modulation transformer secondary coil 16 is connected through D.-C. blocking capacitor 19 to the cathode of grounded screen tetrode R.F. power amplifier tube 18. This cathode connection is via a center tap connection of a transformer coil 20, of a cathode heating power supply transformer 21, connected to the cathode of tube 18.

Two coil modulation reactor 22 is shown to be connected between terminal connection points 23 and 24 and across the series connected secondary coil 16, of modulator transformer 14, and D.-C. blocking capacitor 19. One of the modulation reactor coils 25 is connected to terminal connecting point 23 and the other modulation reactor coil 26 is connected to terminal connecting point 24. High voltage power supply 27 has a positive D.-C. output connection to the other end of modulation transformer coil 25, while a companion high voltage power supply 28 has a minus D.-C. voltage output connection to the other end of modulation reactor coil 26. The other terminals of the high voltage power supplies 27 and 28 are connected in common to ground.

Bypass capacitors 29 and 30 are connected between terminal connection point 31, located in the line between R.F. choke coil 17 and terminal connection point 23, and terminal connection point 32, located in the line between capacitor 19 and the center tapped transformer coil 20 cathode feed of tetrode tube 18. The common junction of capacitors 29 and 30 is connected to ground. R.F. driver staging and grid biasing circuit 33 is shown to have a connection to both the cathode and the grid of grounded screen tetrode R.F. power amplifier tube 18 in order to provide D.-C. grid bias and R.F. carrier signal input to the grid of tube 18. The audio modulated R.F. plate output of tetrode tube 18 is passed through high R.F. voltage coupling capacitor 34 to an R.F. output network transmission line (detail not shown) for which variable capacitor 35, connected between the output side of capacitor 34 and ground, may be used as an R.F. transmission line resonated tuning capacitor. Both sides of the tube 18 cathode and the cathode voltage feed and heating circuit are R.F. bypassed to ground through capacitors 36 and 37, respectively.

In operation of the embodiment of FIGURE 1, since the screen of R.F. power amplifier tetrode tube 18 is operated at ground potential, the necessary cathode (or filament) to screen voltage is achieved by operating the cathode below ground by the desired amount of screen voltage. In this embodiment, the negative high voltage power supply 28 supplies this negative voltage. The positive high voltage power supply 27 in series with a negative high voltage supply 28 furnishes the tube 18 D.-C. plate to cathode voltage. For example, in a working embodiment, the total tube 18 plate to cathode voltage is 15,750 volts with 15,000 of this voltage being positive voltage from the high voltage supply 27 and 750 volts being a negative 750 volts from the negative high voltage supply 28 in series with supply 27. The two power supplies are connected through the modulation reactor coils 25 and 26 to the plate and cathode, respectively, of screen grounded tetrode tube 18.

To achieve 100 percent modulation of the R.F. carrier wave, applied at the grid of tetrode R.F. power amplifier tube 18, it is necessary to super-impose a modulating voltage upon the D.-C. plate voltage with a peak value equal to the D.-C. plate coltage. In this embodiment the peak value of modulation voltages $e_2$ and $e_3$ developed in modulation reactor coils 25 and 26, respectively, must equal 15,750 volts to attain 100 percent modulation. Such modulation voltage is supplied by modulation signal output tubes **12*a* and 12*b* through the modulation transformer 14 with the modulation transformer secondary coil 16 coupled to the R.F. power amplifier tetrode tube 18 through D.-C. blocking capacitor 19. Then, when the voltage drop across this capacitor is negligible, the modulating voltage $e_1$ developed across secondary modulation transformer coil 16 is substantially equal to the modulating voltage $e_2$ developed in modulating reactor coil 25, plus the modulating voltage $e_3$ developed in modulating reactor coil 26**.

It should be noted that any desired percentage of modulation can be applied to the power amplifier screen voltage. This is accomplished by choosing the number of turns on the windings of modulation reactor coils 25 and 26 in the correct ratio. In the working example, since the screen and plate voltages may be modulated 100 percent, the peak value of $e_3$ should equal 750 volts when $e_2$ plus $e_3$ equals 15,750 volts. This requires that the winding turns ratio of coil 25 to coil 26 be 15,000 to 750. Thus, it follows that this turns ratio establishes the relative percentage of screen modulation to plate modulation with, however, substantially no actual power transformation, with respect to plate modulating power, from one coil winding to the other coil winding of the modulator reactor 22.

However, a small amount of transformer action is employed between the coil windings of the modulation reactor 22 to modulate the power amplifier screen input power. The screen current is much smaller than the plate current and is often rather nonlinear with respect to screen voltage over the audio modulation cycle. This screen current adds to the plate current flowing through winding 26 of the modulation reactor. Further, most of the screen modulating power must be transformed from coil winding 25 to coil winding 26. Actually, the amount of power so transformed in practice is very small compared to the plate modulating power thereby permitting leakage reactance between the coil windings 25 and 26 to be advantageously relatively high. This is an important operational fact, making possible such a dual winding modulation reactor design, incorporating enough transformer action to maintain the desired screen modulating voltage.

It should be noted that audio frequency induced currents in the coil windings 25 and 26 must flow through the two high voltage power supplies 27 and 28. With this requirement, the series impedance of the power supplies 27 and 28 to such currents should be relatively small compared to the reactance of the reactor coil windings 25 and 26, a requirement which may be readily met by any of several ways generally known and apparent to those skilled in the art.

In a practical working embodiment of the invention, the circuit capacitance from terminal connection point 32 to ground should be approximately $e2/e3$ times the circuit capacitance from terminal connection point 31 to ground including all effective stray capacitance. To give such relationship, if, for example, the capacitance of capacitor 29 plus stray capacitance (actually stray capacitance alone may be substantially adequate for balance and with capacitor 29 then serving only as an RF bypass to ground) is 5,000 picofarads at audio frequencies, the capacitance of capacitor 30 plus parallel circuit capacitors, including capacitors 36 and 37, and effective stray capacitance should be 100,000 picofarads. Then, at high audio modulation frequencies, capacitors 29 and associated stray capacitances, and 30 in parallel with 36, 37 and associated stray capacitances, form a voltage divider from terminal connection point 31 to terminal connection point 32. This capacitor voltage divider action is a useful feature also tending to force the correct amount of screen modulation. Such voltage divider action is particularly useful in high fidelity transmitters because it aids or reduces the need for effective transformer action between windings 25 and 26 at high audio frequencies where leakage inductance may be troublesome.

Please refer to the embodiment of FIGURE 2 which generally is the same with similar components numbered the same as in the embodiment of FIGURE 1 with, however, additional biasing circuit and R.F. driver staging detail, and with addition of an auxiliary modulation transformer and accompanying circuitary for modulation of the R.F. driver tube plate voltage. This R.F. driver tube plate modulated voltage is applied as an R.F. audio modulated input to the grid of grounded screen R.F. power amplifier tetrode tube 18. In this embodiment, a modulation signal is developed in a secondary winding 38 of auxiliary modulation transformer 39 whose primary coil 40 is connected between terminal connection point 24 and ground, in parallel (for audio signals) with the cathode to screen coil winding 26 of the modulation reactor 22. A D.C. blocking capacitor 41 is provided in series with primary coil winding 40, either between the coil and ground or between terminal connection point 24 and end of coil 40 as shown.

A high voltage supply 42, having one connection to ground, has its positive voltage output terminal of, for example, 3K volts D.C., connected to an end of secondary coil 38 of additional modulation transformer 39, and through the coil 38 to the plate of R.F. driver stage tube 43. This connection also includes a coil 44 acting as an R.F. choke between the plate output of R.F. driver tube 43 and the transformer coil 38, and also at the lower end of coil 44 a connection through capacitor 45 to ground, as an R.F. bypass to ground. Capacitor 46, connected between the output end of secondary coil 38 and ground, also acts as an R.F. bypass to ground at that point. The plate of tube 43 which is part of R.F. driver staging and grid biasing circuitry, indicated by 33 in the embodiment of FIGURE 1, is also connected through capacitors 47 and 48 to ground, and from the common junction of capacitors 47 and 48 to the grid of R.F. power amplifier tetrode tube 18. Bias circuit 49, which, in the embodiment of FIGURE 1, is part of circuit 33, is connected between the cathode and grid of tube 18 to provide the desired D.C. bias in a manner familiar to those skilled in the art. The auxiliary transformer 39 modulating circuit has the advantage of keeping R.F. driver tube 43 plate modulating voltage more nearly in phase with the R.F. power amplifier tetrode tube 18 plate and screen modulation. The added modulation circuit more closely maintains the in-phase relationship than would be the case with an additional secondary winding operating directly from the modulation transformer 14. This is due primarily to a large phase shift encountered across blocking capacitor 19, particularly at low audio frequencies.

Thus, it may be seen that this invention provides circuitry for modulating both the plate and cathode potentials, and by modulation of cathode potential attainment of screen voltage modulation of an R.F. power amplifier tetrode tube screen grounded directly to a chassis deck, or having any other convenient means of screen grounding. This modulation system herein disclosed, and the results obtained with screen grounded tetrodes, would also be applicable in corresponding modulation of screen grounded pentode tubes designed for such R.F. high power amplifier usage. A push-pull modulation signal fed to a modulator transformer develops a modulator signal output from the modulator transformer that is applied between the plate and cathode of the R.F. power amplifier tetrode tube. It is a system utilizing a modulator reactor having two mutually coupled windings, one coil winding larger than the other and with adjacent terminals of the two coil windings connected to respective voltage supplies and through the voltage supplies to a common ground. The modulation reactor has a dual function in providing a path through one winding for applying high voltage D.C. to the plate of the R.F. power amplifier tetrode tube, and by transformer action developing the cathode to screen modulating voltage across the second winding. Furthermore, it is a circuit maintaining plate and screen modulating voltages very nearly in phase over the entire audio range. The capacitance shunt problems normally existing in many conventional tetrode power amplifier circuits are generally avoided. Even further, the mutually coupled coil windings of the modulator reactor act to provide the proper audio frequency A.C. voltage division. When this division is substantially the same as the dual high voltage D.C. supply ratios, the modulation system is capable of 100 percent amplitude modulation of the tetrode class C R.F. power amplifier output tube 18.

Whereas this invention is here illustrated and described with respect to several embodiments thereof, it should be realized that various changes may be made without departing from the essential contributions to the art made by the teachings hereof.

I claim:

1. In a modulation circuit for high level amplitude modulation of a multi-electrode grounded screen R.F. power amplifier tube: said tube having at least four electrodes including an output plate, a cathode, grid, and the ground screen; a modulation signal source; a modulation transformer receiving an audio input signal from said modulation signal source; said modulation transformer having two terminal signal output connective means for applying the modulation transformer output signal between the plate and cathode of said multi-element tube; a modulation reactor connected between output terminals of the modulation transformer; a D.-C. blocking capacitor between the modulation reactor and an output terminal of the modulation transformer; said modulation reactor having two coil windings, a first coil winding connected to the plate of said multi-element tube, and a second coil winding connected to the cathode of said multi-element tube; two high voltage supplies having a common connection to ground, with one of the supplies being a positive D.-C. voltage supply having a positive D.-C. terminal connection to said first coil winding and through the first coil winding to the plate of said multi-element tube, and the other high voltage supply being a negative D.-C. voltage supply having a negative D.–C. terminal connection to said second coil winding and through the second coil winding to the cathode of said multi-element tube R.F. driver signal means connected to the grid of said multi-element tube; and biasing circuit means connected between the cathode and grid of said tube.

2. The modulation circuit of claim 1 wherein, the grounded screen R.F. power amplifier tube is an R.F. power amplifier tetrode tube.

3. The modulation circuit of claim 1 wherein, the positive D.-C. voltage supply provides a predetermined positive D.-C. voltage output level; said negative D.-C. voltage supply provides a predetermined negative D.-C. voltage output level; said first coil winding and said second coil winding of said modulation reactor being relatively closely spaced for desired transformer action, and with said coil windings having a turns ratio substantially equal to the voltage ratios of said high voltage D.-C. power supplies to provide peak audio induced voltages in the respective coils equal to the D.-C. output voltage levels of the respective positive and negative high voltage supplies and with the closely adjacent ends of the two coil windings substantially at A.-C. ground.

4. The modulation circuit of claim 3 wherein, the modulation signal source provides a push-pull modulator signal through two lines to opposite ends of a primary coil of said modulator transformer and wherein the modulator transformer secondary coil has opposite end output terminals in which a push-pull peak voltage is developed substantially equal to the total peak voltages of both of said coil windings of the modulation reactor when the voltage drop across said D.-C. blocking capacitor is at a minimum.

5. The modulation circuit of claim 3 wherein, the D.-C. output level of said positive high voltage supply is of a predetermined magnitude, greater than the magnitude of the negative output of said negative high voltage supply; and wherein the ratio of the coil winding turns of the modulation reactor coil winding connected to the plate of said multi-element tube is a greater number of predetermined turns than the number of turns of the modulation reactor coil winding connected to the cathode of said multi-element tube at substantially the same ratio as the ratio of D.-C. voltage output magnitudes of both said positive and negative high voltage supplies and in the same order.

6. The modulator circuit of claim 3 wherein, an auxiliary modulation transformer modulating circuit is provided for modulating an R.F. driver carrier input to the grid of said tube for closely maintaining the in-phase relationship of such R.F. driver output modulation to the phase of tube plate and cathode-screen voltage modulation, including: an auxiliary modulation transformer having a primary coil connected between the cathode side of the modulation circuit between said D.-C. blocking capacitor and the cathode of said multi-element tube, in series with an additional capacitor to ground; and said auxiliary modulation transformer having a secondary coil connected between the positive output terminal of a voltage supply and the plate output of the R.F. driving circuitry providing the R.F. driver carrier input.

7. The modulation circuit of claim 1 wherein, an auxiliary modulation transformer modulating circuit is provided for modulating an R.F. driver carrier input to the grid of said tube for closely maintaining the in-phase relationship of such R.F. driver output modulation to the phase of tube plate and cathode-screen voltage modulation, including: an auxiliary modulation transformer having a primary coil connected between the cathode side of the modulation circuit between said D.-C. blocking capacitor and the cathode of said multi-element tube, in series with an additional capacitor to ground; and said auxiliary modulation transformer having a secondary coil connected between the positive output terminal of a voltage supply and the plate output of the R.F. driving circuitry providing the R.F. driver carrier input.

8. The modulation circuit of claim 1 wherein, the capacitance value in the modulation circuit, including stray capacitances, between the tube plate side of the modulation circuit and ground, through at least some of the audio operating frequency range, and within the R.F. carrier adjustable range, is so counterbalanced by capacitance value, including stray capacitances, between the cathode side of the modulation circuit and ground that the ratio of such total capacitance values, within limited operational frequency parameters, between the cathode side of the modulation circuit to ground to the total value of the capacitance from the plate side of the modulation circuit to ground is substantially equal to the ratio of the positive high voltage supply to the negative high voltage supply.

9. The modulation circuit of claim 8 wherein, an auxiliary modulation transformer modulating circuit is provided for modulating an R.F. driver carrier input to the grid of said tube for closely maintaining the in-phase relationship of such R.F. driver output modulation to the phase of tube plate and cathode screen voltage modulation, including: an auxiliary modulation transformer having a primary coil connected between the cathode side of the modulation circuit between said D.-C. blocking capacitor and the cathode of said multi-element tube, in series with an additional capacitor to ground; and said auxiliary modulation transformer having a secondary coil connected between the positive output terminal of a voltage supply and the plate output of the R.F. driving circuitry providing the R.F. driver carrier input.

No references cited.

ROY LAKE, *Primary Examiner.*

A. L. BRODY, *Assistant Examiner.*